United States Patent
Ding et al.

(10) Patent No.: US 10,604,834 B2
(45) Date of Patent: Mar. 31, 2020

(54) TITANIUM NICKEL NIOBIUM ALLOY BARRIER FOR LOW-EMISSIVITY COATINGS

(71) Applicant: GUARDIAN GLASS, LLC, Auburn Hills, MI (US)

(72) Inventors: Guowen Ding, San Jose, CA (US); Brent Boyce, Novi, MI (US); Jeremy Cheng, Cupertino, CA (US); Muhammad Imran, Brownstown, MI (US); Jingyu Lao, Saline, MI (US); Minh Huu Le, San Jose, CA (US); Daniel Schweigert, Fremont, CA (US); Zhi-Wen Wen Sun, Sunnyvale, CA (US); Yu Wang, San Jose, CA (US); Yongli Xu, Plymouth, MI (US); Guizhen Zhang, Santa Clara, CA (US)

(73) Assignee: GUARDIAN GLASS, LLC, Auburn Hills, MI (US)

( * ) Notice: Subject to any disclaimer, the term of this patent is extended or adjusted under 35 U.S.C. 154(b) by 0 days.

(21) Appl. No.: 14/661,958

(22) Filed: Mar. 18, 2015

(65) Prior Publication Data

US 2015/0191815 A1    Jul. 9, 2015

Related U.S. Application Data

(63) Continuation-in-part of application No. 13/797,504, filed on Mar. 12, 2013, now abandoned.

(51) Int. Cl.
*C23C 14/08* (2006.01)
*C03C 17/36* (2006.01)
(Continued)

(52) U.S. Cl.
CPC .............. *C23C 14/08* (2013.01); *C03C 17/36* (2013.01); *C03C 17/366* (2013.01);
(Continued)

(58) Field of Classification Search
CPC ........................................... C03C 17/36–3681
See application file for complete search history.

(56) References Cited

U.S. PATENT DOCUMENTS 7,964,285 B2 * 6/2011 Hartig .................... C03C 17/36
428/426
2007/0248791 A1   10/2007 Hartig
(Continued)

FOREIGN PATENT DOCUMENTS

| EA | 012597 | 10/2009 |
|----|--------|---------|
| EA | 15109  | 6/2011  |

(Continued)

OTHER PUBLICATIONS

RU Application No. 2015143190 Decision to Grant dated Feb. 1, 2018.
(Continued)

*Primary Examiner* — Alex A Rolland

(57) ABSTRACT

A method for making low emissivity panels, including control the composition of a barrier layer formed on a thin conductive silver layer. The barrier structure can include a ternary alloy of nickel, titanium, and niobium, which showed improvements in overall performance than those from binary barrier results. The percentage of nickel can be between 5 and 15 wt %. The percentage of titanium can be between 30 and 50 wt %. The percentage of niobium can be between 40 and 60 wt %.

8 Claims, 8 Drawing Sheets

(51) Int. Cl.
*G02B 5/20* (2006.01)
*G02B 5/08* (2006.01)
*C23C 14/34* (2006.01)
*C23C 14/00* (2006.01)
*C23C 14/18* (2006.01)
*E06B 3/66* (2006.01)

(52) U.S. Cl.
CPC ...... *C03C 17/3618* (2013.01); *C03C 17/3644* (2013.01); *C03C 17/3681* (2013.01); *C23C 14/0036* (2013.01); *C23C 14/083* (2013.01); *C23C 14/185* (2013.01); *C23C 14/3464* (2013.01); *E06B 3/66* (2013.01); *G02B 5/0875* (2013.01); *G02B 5/208* (2013.01); *Y10T 428/12611* (2015.01)

(56) References Cited

U.S. PATENT DOCUMENTS

| | | |
|---|---|---|
| 2008/0268262 A1 | 10/2008 | Hartig et al. |
| 2009/0047466 A1 | 2/2009 | German et al. |
| 2012/0087005 A1 | 4/2012 | Reymond et al. |
| 2012/0225316 A1 | 9/2012 | Imran et al. |
| 2012/0225317 A1* | 9/2012 | Imran .................. C03C 17/36 428/630 |
| 2014/0186636 A1 | 7/2014 | Imran et al. |
| 2014/0268301 A1 | 9/2014 | Ding et al. |
| 2014/0272354 A1 | 9/2014 | Ding et al. |
| 2014/0272455 A1 | 9/2014 | Ding et al. |

FOREIGN PATENT DOCUMENTS

| | | |
|---|---|---|
| FR | 2 946 639 | 12/2010 |
| JP | 2014-508094 | 4/2014 |
| RU | 2 406 704 | 12/2010 |
| RU | 2528730 | 9/2014 |
| WO | WO 2012/118469 | 9/2012 |
| WO | WO 2014/164989 | 10/2014 |

OTHER PUBLICATIONS

Russian Office Action dated Sep. 6, 2019 for RU Application No. 2017135082.

* cited by examiner

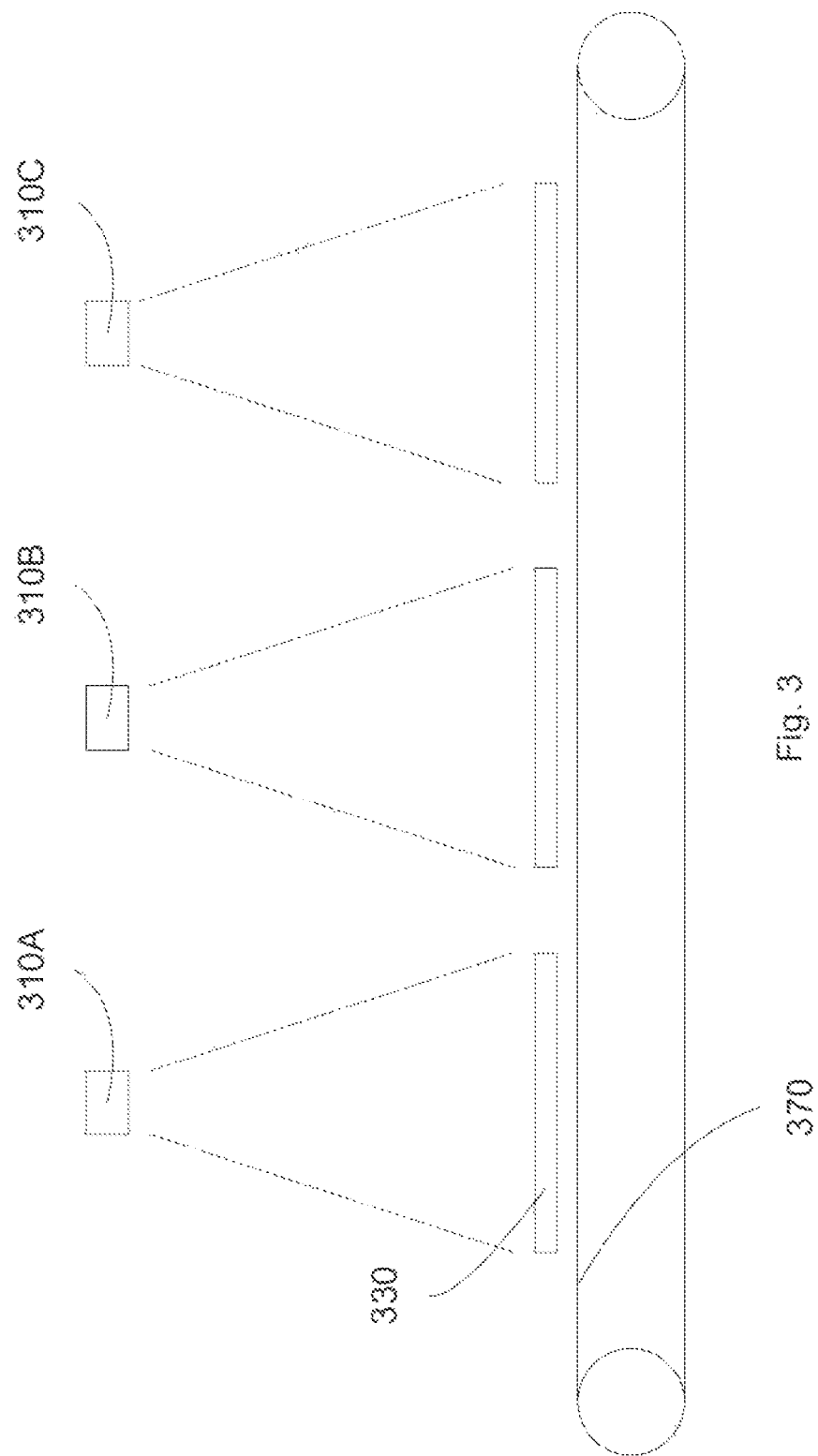

| Base Material | Dopant or Alloy | Alloy Conc (wt%) | Ni:Ti:Nb | Best Thk (Å) | Tape Test (P/F) | Avis (%) | Abs % (400 nm) | Abs % (550 nm) | Abs % (1000 nm) | n (400nm) | n (550nm) | Δn * | Rs (ohm/sq) | ε (%) | ε / Rs |
|---|---|---|---|---|---|---|---|---|---|---|---|---|---|---|---|
| NiCr (80:20) | None | 0 | | 15 | P. | 11.6 | 12 | 11.1 | 20 | 0.81 | 0.37 | 0.44 | 7.2 | 9.1 | 1.27 |
| NiTi | None | 0 | 20:80:0 | 20 | P. | 8.9 | 8.5 | 6.5 | 13.8 | 0.23 | 0.18 | 0.05 | 6.8 | 8.4 | 1.22 |
| NiTi (20:80) | Nb | 25 | 15:60:25 | 20 | P. | 7.8 | 9.4 | 7.5 | 15.9 | 0.33 | 0.24 | 0.09 | 6.3 | 8.1 | 1.28 |
| | Nb | 50 | 10:40:50 | 20 | P. | 6.8 | 8.2 | 6.2 | 12.5 | 0.3 | 0.16 | 0.14 | 6.3 | 8.4 | 1.33 |
| | Nb | 75 | 5:20:75 | 15 | P. | 6.9 | 8.3 | 6.6 | 14.1 | 0.27 | 0.18 | 0.1 | 6.6 | 8.5 | 1.29 |

Fig. 7

TITANIUM NICKEL NIOBIUM ALLOY BARRIER FOR LOW-EMISSIVITY COATINGS

CROSS-REFERENCE TO RELATED APPLICATIONS

This is a Continuation-in-Part application of U.S. patent application Ser. No. 13/797,504, filed on Mar. 12, 2013, which is herein incorporated by reference for all purposes.

TECHNICAL FIELD

The present invention relates generally to films providing high transmittance and low emissivity, and more particularly to such films deposited on transparent substrates.

BACKGROUND

Sunlight control glasses are commonly used in applications such as building glass windows and vehicle windows, typically offering high visible transmission and low emissivity. High visible transmission can allow more sunlight to pass through the glass windows, thus being desirable in many window applications. Low emissivity can block infrared (IR) radiation to reduce undesirable interior heating.

In low emissivity glasses, IR radiation is mostly reflected with minimum absorption and emission, thus reducing the heat transferring to and from the low emissivity surface. Low emissivity, or low-e, panels are often formed by depositing a reflective layer (e.g., silver) onto a substrate, such as glass. The overall quality of the reflective layer, such as with respect to texturing and crystallographic orientation, is important for achieving the desired performance, such as high visible light transmission and low emissivity (i.e., high heat reflection). In order to provide adhesion, as well as protection, several other layers are typically formed both under and over the reflective layer. The various layers typically include dielectric layers, such as silicon nitride, tin oxide, and zinc oxide, to provide a barrier between the stack and both the substrate and the environment, as well as to act as optical fillers and function as anti-reflective coating layers to improve the optical characteristics of the panel.

One known method to achieve low emissivity is to form a relatively thick silver layer. However, as the thickness of the silver layer increases, the visible light transmission of the reflective layer is reduced, as is manufacturing throughput, while overall manufacturing costs are increased. Therefore, is it desirable to form the silver layer as thin as possible, while still providing emissivity that is suitable for low-e applications.

SUMMARY

In some embodiments, barrier structures, and methods for forming the barrier structures, for an infrared reflective layer are provided to be used in low emissivity coatings. The barrier structures can include a ternary alloy of titanium, nickel and niobium. The percentage of titanium can be between 5 and 15 wt %. The percentage of nickel can be between 30 and 50 wt %. The percentage of niobium can be between 40 and 60 wt %.

In some embodiments, barrier structures, and methods for forming the barrier structures, for an infrared reflective layer are provided to be used in low emissivity coatings. The barrier structures can include a ternary alloy of nickel, titanium, and niobium. The percentage of nickel can be between 5 and 15 wt %. The percentage of titanium can be between 30 and 50 wt %. The percentage of niobium can be between 40 and 60 wt %.

In some embodiments, the infrared reflective layer is formed on an underlayer, such as an antireflective layer or a seed layer. The underlayer can include metal oxide materials, such as zinc oxide, doped zinc oxide, tin oxide, doped tin oxide, or an oxide alloy of zinc and tin.

In some embodiments, the barrier structures can be optimized for both optical and mechanical properties, including low visible light absorption, high visible light transmission, high infrared reflection, and high mechanical durability and adhesion performance. For example, the high content of nickel and niobium can improve the durability of the coated layers, such as by strengthening the interface with a silver layer. The ternary alloy can show better overall performance as compared to binary nickel alloys and to other composition ranges of ternary nickel alloys.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 3 illustrates an exemplary in-line deposition system according to some embodiments.

FIG. 7 illustrates a table of data relating to the performance of various materials as barrier layers.

DETAILED DESCRIPTION

Figure 1A:
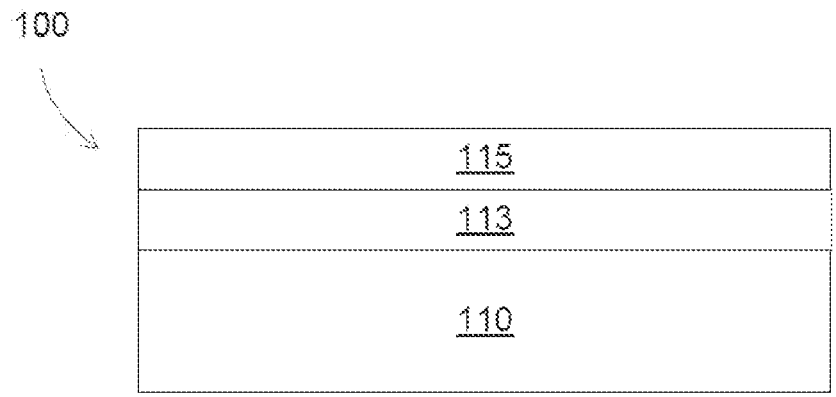
FIG. 1A illustrates an exemplary thin film coating according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and apparatuses for making coated panels are disclosed. The coated panels can include coated layers formed thereon, such as a low resistivity thin infrared reflective layer having a conductive material such as silver. The infrared reflective layer can include a conductive material, with the percentage of reflectance proportional to the conductivity. Thus a metallic layer, for example silver, can be used as infrared reflective layer in low emissivity coatings. To maintain the conductivity of the infrared reflective layer, e.g., silver layer, for example, against oxidation from deposition of subsequent layers or from subsequent high temperature anneals, a barrier layer can be formed on the silver layer.

In some embodiments, methods and apparatuses for making low emissivity coated panels, which include depositing a barrier layer on a conductive layer such as silver in such conditions so that the resistivity of silver, and consequently the emissivity of the coated panels, is optimum are disclosed. For example, the low resistive silver layer or the low emissivity panel can be achieved by being protected with a barrier layer including an alloy of titanium, niobium and nickel.

Titanium can be used as a barrier for silver in low emissivity coatings, partly due to its high oxygen affinity, e.g., attracting oxygen to prevent oxidation of the silver layer. Low emissivity coatings utilizing titanium barrier can exhibit excellent visible light transmission, together with minimal infrared reflectivity. However, low emissivity coatings utilizing titanium barrier can show poor mechanical durability, probably due to poor adhesion with the silver layer.

Nickel can be added to a titanium barrier layer to modify the barrier characteristics. In general, titanium nickel alloys can improve corrosion resistance to acidic or alkaline solutions, together with providing protection during high temperature oxidation. Nickel-inclusive alloys have been reported to have sufficient adhesion to the IR reflecting layer, leading to improved overall chemical and mechanical durability.

In some embodiments, various nickel alloys have been evaluated, including binary nickel alloys (e.g., nickel chromium and nickel titanium), and ternary nickel alloys (e.g., nickel titanium niobium). In general, different binary nickel alloys can show different performance in different requirements. For example, nickel titanium can provide minor improvement in light transmission, with minimal improvement in mechanical durability. More nickel content in a titanium nickel alloy can slightly improve the adhesion with silver. For example, 80 wt % nickel in titanium nickel alloys can show better adhesion than titanium nickel alloys having 50 wt % nickel. In contrast, nickel chromium can provide significant improvement in mechanical durability, but with worse performance in optical properties.

In some embodiments, ternary alloys of nickel, titanium and niobium can show better overall performance, e.g., better mechanical durability as compared to titanium, with improved adhesion to the silver layer. The nickel, titanium and niobium ternary alloys can also provide similar, or slightly improvement, in optical performance, e.g., reducing emissivity and absorption together with increasing light transmittance. For example, resistance measurement data indicates that the ternary alloys provide better barrier protection than titanium and binary alloys, e.g., NiTi or NiCr.

Literature seems to suggest that niobium in titanium alloys can segregate to the interface, thus can be helpful in improve silver adhesion. However, not all ternary alloys of titanium, nickel and niobium can show good optical, electrical, and mechanical performance.

In some embodiments, ternary alloys of titanium, nickel and niobium with various ranges of composition are disclosed, which can provide excellent overall performance, including good optical properties together with good mechanical properties. For example, a high percentage of niobium, e.g., between 40 and 60 wt %, can be used to improve the mechanical durability without affecting the optical or electrical properties. Similarly, a relatively high percentage of nickel, e.g., higher than titanium but lower than niobium, such as between 30 and 50 wt %, can be used to improve the mechanical durability without affecting the optical or electrical properties. The percentage of titanium can be low, e.g., between 5 and 15 wt %, to provide the desired optical properties. As an example, a ternary alloy having 50 wt % niobium, 40 wt % nickel, and 10 wt % titanium can show better overall performance as compared with titanium and titanium-nickel alloys.

In some embodiments, ternary alloys of titanium, nickel and niobium with various ranges of composition are disclosed, which can provide, for example, desirable (i.e., relatively low) absorption, resistance, and emissivity. The alloys may include a high percentage of niobium, e.g., between 40 and 60 wt %, can be used to improve the mechanical durability without affecting the optical or electrical properties. A relatively high percentage of titanium, e.g., higher than nickel but lower than niobium, such as between 30 and 50 wt %, can be used. The percentage of nickel can be low, e.g., between 5 and 15 wt %. As an example, a ternary alloy may include 50 wt % niobium, 40 wt % titanium, and 10 wt % nickel.

In some embodiments, the barrier layer can include ternary oxide alloys of titanium, nickel and niobium. The oxide alloy barrier can be a stoichiometric oxide, e.g., containing enough oxygen to oxidize the ternary alloy. The oxide alloy barrier can be a sub-oxide alloy, e.g., the amount of oxygen atoms in the oxide alloy is less than the stoichiometric ratio.

The barrier layer can improve the low emissivity coated panels, for example, by reducing absorption in the visible range, e.g., allowing high transmission of visible light, minimizing or eliminating reactivity with Ag, which can prevent degradation of the color of the coated system, resulting in color-neutral panels, and improving adhesion between Ag and the top barrier layer.

In some embodiments, methods and apparatuses for making low emissivity panels which include a low resistivity thin infrared reflective layer including a conductive material such as silver, gold, or copper are disclosed. The thin silver layer can be thinner than 15 nm, such as 7 or 8 nm. The silver layer can have low roughness, and is preferably deposited on a seed layer also having low roughness. The low emissivity panels can have improved overall quality of the infrared reflective layer with respect to conductivity, physical roughness and thickness. For example, the methods allow for improved conductivity of the reflective layer such that the thickness of the reflective layer may be reduced while still providing desirably low emissivity.

In general, the reflective layer preferably has low sheet resistance, since low sheet resistance is related to low emissivity. In addition, the reflective layer is preferably thin to provide high visible light transmission. Thus in some embodiments, methods and apparatuses to deposit a thin and highly conductive reflective layer, providing a coated layer with high visible transmittance and low infrared emissivity are disclosed. The methods can also maximize volume production, throughput, and efficiency of the manufacturing process used to form low emissivity panels.

In some embodiments, improved coated transparent panels, such as a coated glass, that has acceptable visible light transmission and IR reflection are disclosed. Methods of producing the improved, coated, transparent panels, which comprise specific layers in a coating stack are also disclosed.

The coated transparent panels can include a glass substrate or any other transparent substrates, such as substrates made of organic polymers. The coated transparent panels can be used in window applications such as vehicle and building windows, skylights, or glass doors, either in monolithic glazings or multiple glazings with or without a plastic interlayer or a gas-filled sealed interspace.

FIG. 1A illustrates an exemplary thin film coating according to some embodiments. A barrier layer 115 is disposed on an infrared reflective layer 113, such as a silver layer, which is disposed on a substrate 110 to form a coated transparent panel 100, which has high visible light transmission, and low IR emission.

The layer 115 can be sputtered deposited using different processes and equipment, for example, the targets can be sputtered under direct current (DC), pulsed DC, alternate current (AC), radio frequency (RF) or any other suitable conditions. In some embodiments, physical vapor deposition methods for depositing a layer 115 with minimum effect on the infrared reflective layer 113 are disclosed.

The infrared reflective layer can include a conductive material, with the percentage of reflectance proportional to the conductivity. Metals are typically used as infrared reflective layers, with silver offering between 95-99% and gold 98-99% reflectivity in the infrared region. Thus a metallic layer, for example silver, can be used as infrared reflective layer in low emissivity coatings. The deposition of the silver layer can be optimized to obtain high conductivity, for example, by minimizing the impurities in the silver layer.

For the silver layer to be as pure as possible, the layer immediately on top of the silver layer (e.g., the barrier layer) is very important in protecting the silver from oxidation, such as during oxygen reactive sputtering process in the deposition of subsequent layers. In addition, this barrier layer can protect the silver layer against reaction with oxygen diffusion during the glass tempering process, or during long term use where the piece of glass may be exposed to moisture or environment.

To maintain the conductivity of the infrared reflective layer, e.g., silver layer, for example, against oxidation from deposition of subsequent layers or from subsequent high temperature anneals, a barrier layer can be formed on the silver layer. The barrier layer can be an oxygen diffusion barrier, protecting the silver layer from oxygen diffusing through the barrier to the react with the silver layer.

In addition to the oxygen diffusion barrier property, there are other desirable properties for the barrier layer. For example, since the barrier layer is placed directly on the silver layer, low or no solubility of the barrier material in silver is desirable to minimize reactivity between the barrier layer and silver at the interface. The reaction between the barrier layer and silver can introduce impurity to the silver layer, potentially reducing the conductivity.

Further, in the fabrication of low emissivity coating panels, high temperature processes can be used, for example, to anneal the deposited films or to tempering the glass substrate. The high temperature processes can have adverse effects on the low emissivity coating, such as changing the structure or the optical properties, e.g., index of refraction n or absorption coefficient k, of the coated films. Thus thermal stability with respect to optical properties is desirable, for example, barrier material might have low extinction coefficient, e.g., low visible absorption, in both metallic form and oxide form.

In some embodiments, barrier structures, and methods for forming the same, for an infrared reflective layer to be used in low emissivity coatings are disclosed. The barrier structures can be formed on an infrared reflective layer to protect the infrared reflective layer from impurity diffusion, together with exhibiting good adhesion and good optical properties, for example, during the fabrication process.

The barrier structure can include a ternary alloy of titanium, nickel and niobium. High percentage of niobium and lower percentage of nickel, e.g., lower than that of niobium, can be used to improve the mechanical durability properties while not affecting the optical properties. Low percentage of nickel, e.g., lower than those of niobium and titanium, can be used to provide an oxygen diffusion barrier to the silver underlayer.

In some embodiments, methods for forming a layer 115 on a high transmittance, low emissivity coated article having a substrate and a smooth metallic reflective film including one of silver, gold, or copper are disclosed. In some embodiments, other layers can be included, such as an oxide layer, a seed layer, a conductive layer, an antireflective layer, or a protective layer.

In some embodiments, coating stacks comprising multiple layers for different functional purposes are disclosed. For example, the coating stacks can comprise a seed layer to facilitate the deposition of the reflective layer, an oxygen diffusion layer disposed on the reflective layer to prevent oxidation of the reflective layer, a protective layer disposed on the substrate to prevent physical or chemical abrasion, or an antireflective layer to reduce visible light reflection. The coating stacks can comprise multiple layers of reflective layers to improve IR emissivity.

Figure 1B:
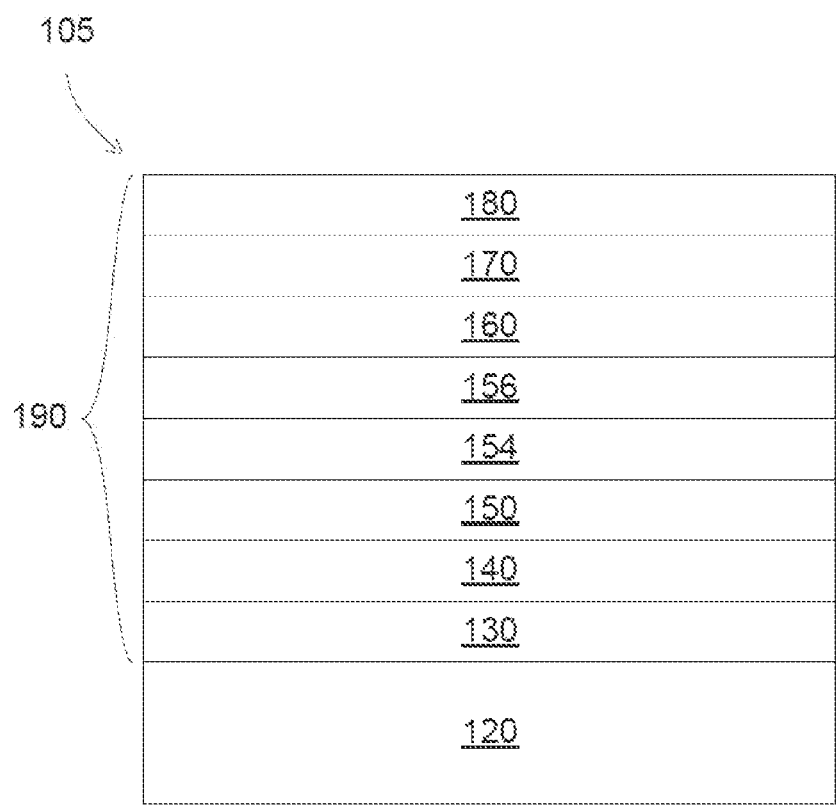
FIG. 1B illustrates a low emissivity transparent panel 105 according to some embodiments.

FIG. 1B illustrates a low emissivity transparent panel 105 according to some embodiments. The low emissivity transparent panel can comprise a glass substrate 120 and a low emissivity (low-e) stack 190 formed over the glass substrate 120. The glass substrate 120 in some embodiments is made of a glass, such as borosilicate glass, and has a thickness of, for example, between 1 and 10 millimeters (mm). The substrate 120 may be square or rectangular and about 0.5-2 meters (m) across. In some embodiments, the substrate 120 may be made of, for example, plastic or polycarbonate.

The low-e stack 190 includes a lower protective layer 130, a lower oxide layer 140, a seed layer 150, a reflective layer 154, a barrier layer 156, an upper oxide 160, an optical filler layer 170, and an upper protective layer 180. Some layers can be optional, and other layers can be added, such as interface layers or adhesion layers. Exemplary details as to the functionality provided by each of the layers 130-180 are provided below.

The various layers in the low-e stack 190 may be formed sequentially (i.e., from bottom to top) on the glass substrate 120 using a physical vapor deposition (PVD) and/or reactive (or plasma enhanced) sputtering processing tool. In some embodiments, the low-e stack 190 is formed over the entire glass substrate 120. However, in other embodiments, the low-e stack 190 may only be formed on isolated portions of the glass substrate 120.

The lower protective layer 130 is formed on the upper surface of the glass substrate 120. The lower protective layer 130 can comprise silicon nitride, silicon oxynitride, or other nitride material such as SiZrN, for example, to protect the other layers in the stack 190 from diffusion from the substrate 120 or to improve the haze reduction properties. In some embodiments, the lower protective layer 130 is made of silicon nitride and has a thickness of, for example, between about 10 nm to 50 nm, such as 25 nm.

The lower oxide layer 140 is formed on the lower protective layer 130 and over the glass substrate 120. The lower oxide layer is preferably a metal or metal alloy oxide layer and can serve as an antireflective layer. The lower metal oxide layer 140 may enhance the crystallinity of the reflective layer 154, for example, by enhancing the crystallinity of a seed layer for the reflective layer, as is described in greater detail below.

The layer 150 can be used to provide a seed layer for the IR reflective film, for example, a zinc oxide layer deposited before the deposition of a silver reflective layer can provide a silver layer with lower resistivity, which can improve its reflective characteristics. The seed layer can comprise a metal such as titanium, zirconium, and/or hafnium, or a metal alloy such as zinc oxide, nickel oxide, nickel chrome oxide, nickel alloy oxides, chrome oxides, or chrome alloy oxides.

In some embodiments, the seed layer 150 can be made of a metal, such as titanium, zirconium, and/or hafnium, and has a thickness of, for example, 50 A or less. Generally, seed layers are relatively thin layers of materials formed on a surface (e.g., a substrate) to promote a particular characteristic of a subsequent layer formed over the surface (e.g., on the seed layer). For example, seed layers may be used to affect the crystalline structure (or crystallographic orientation) of the subsequent layer, which is sometimes referred to as "templating." More particularly, the interaction of the material of the subsequent layer with the crystalline structure of the seed layer causes the crystalline structure of the subsequent layer to be formed in a particular orientation.

For example, a metal seed layer is used to promote growth of the reflective layer in a particular crystallographic orientation. In some embodiments, the metal seed layer is a material with a hexagonal crystal structure and is formed with a (002) crystallographic orientation which promotes growth of the reflective layer in the (111) orientation when the reflective layer has a face centered cubic crystal structure (e.g., silver), which is preferable for low-e panel applications.

In some embodiments, the crystallographic orientation can be characterized by X-ray diffraction (XRD) technique, which is based on observing the scattered intensity of an X-ray beam hitting the layer, e.g., silver layer or seed layer, as a function of the X-ray characteristics, such as the incident and scattered angles. For example, zinc oxide seed layer can show a pronounced (002) peak and higher orders in a θ-2θ diffraction pattern. This suggests that zinc oxide crystallites with the respective planes oriented parallel to the substrate surface are present.

In some embodiments, the terms "silver layer having (111) crystallographic orientation", or "zinc oxide seed layer having (002) crystallographic orientation" include a meaning that there is a (111) crystallographic orientation for the silver layer or a (002) crystallographic orientation for the zinc oxide seed layer, respectively. The crystallographic orientation can be determined, for example, by observing pronounced crystallography peaks in an XRD characterization.

In some embodiments, the seed layer 150 can be continuous and covers the entire substrate. Alternatively, the seed layer 150 may not be formed in a completely continuous manner. The seed layer can be distributed across the substrate surface such that each of the seed layer areas is laterally spaced apart from the other seed layer areas across the substrate surface and do not completely cover the substrate surface. For example, the thickness of the seed layer 150 can be a monolayer or less, such as between 2.0 and 4.0 Å, and the separation between the layer sections may be the result of forming such a thin seed layer (i.e., such a thin layer may not form a continuous layer).

The reflective layer 154 is formed on the seed layer 150. The IR reflective layer can be a metallic, reflective film, such as silver, gold, or copper. In general, the IR reflective film comprises a good electrical conductor, blocking the passage of thermal energy. In some embodiments, the reflective layer 154 is made of silver and has a thickness of, for example, 100 Å. Because the reflective layer 154 is formed on the seed layer 150, for example, due to the (002) crystallographic orientation of the seed layer 150, growth of the silver reflective layer 154 in a (111) crystalline orientation is promoted, which offers low sheet resistance, leading to low panel emissivity.

Because of the promoted (111) textured orientation of the reflective layer 154 caused by the seed layer 150, the conductivity and emissivity of the reflective layer 154 is improved. As a result, a thinner reflective layer 154 may be formed that still provides sufficient reflective properties and visible light transmission. Additionally, the reduced thickness of the reflective layer 154 allows for less material to be used in each panel that is manufactured, thus improving manufacturing throughput and efficiency, increasing the usable life of the target (e.g., silver) used to form the reflective layer 154, and reducing overall manufacturing costs.

Further, the seed layer 150 can provide a barrier between the metal oxide layer 140 and the reflective layer 154 to reduce the likelihood of any reaction of the material of the reflective layer 154 and the oxygen in the lower metal oxide layer 140, especially during subsequent heating processes. As a result, the resistivity of the reflective layer 154 may be reduced, thus increasing performance of the reflective layer 154 by lowering the emissivity.

Formed on the reflective layer 154 is a barrier layer 156, which can protect the reflective layer 154 from being oxidized. For example, the barrier can be a diffusion barrier, stopping oxygen from diffusing into the silver layer from the upper oxide layer 160. The barrier layer 156 can include titanium, nickel, and niobium. In some embodiments, the barrier layer 156 can include titanium, nickel, niobium, and oxygen.

Formed on the barrier layer 156 is an upper oxide layer, which can function as an antireflective film stack, including a single layer or multiple layers for different functional purposes. The antireflective layer 160 serves to reduce the reflection of visible light, selected based on transmittance, index of refraction, adherence, chemical durability, and thermal stability. In some embodiments, the antireflective layer 160 comprises tin oxide, offering high thermal stability properties. The antireflective layer 160 can also include titanium dioxide, silicon nitride, silicon dioxide, silicon oxynitride, niobium oxide, SiZrN, tin oxide, zinc oxide, or any other suitable dielectric material.

The optical filler layer 170 can be used to provide a proper thickness to the low-e stack, for example, to provide an antireflective property. The optical filler layer preferably has high visible light transmittance. In some embodiments, the optical filler layer 170 is made of tin oxide and has a thickness of, for example, 100 Å. The optical filler layer may be used to tune the optical properties of the low-e panel 105. For example, the thickness and refractive index of the optical filler layer may be used to increase the layer thickness to a multiple of the incoming light wavelengths, effectively reducing the light reflectance and improving the light transmittance.

An upper protective layer 180 can be used for protecting the total film stack, for example, to protect the panel from physical or chemical abrasion. The upper protective layer 180 can be an exterior protective layer, such as silicon nitride, silicon oxynitride, titanium oxide, tin oxide, zinc oxide, niobium oxide, or SiZrN.

In some embodiments, adhesion layers can be used to provide adhesion between layers. The adhesion layers can be made of a metal alloy, such as nickel-titanium, and have a thickness of, for example, 30 Å.

Depending on the materials used, some of the layers of the low-e stack 190 may have some elements in common. An example of such a stack may use a zinc-based material in the oxide dielectric layers 140 and 160. As a result, a relatively low number of different targets can be used for the formation of the low-e stack 190.

In some embodiments, the coating can comprise a double or triple layer stack, having multiple IR reflective layers. In some embodiments, the layers can be formed using a plasma enhanced, or reactive sputtering, in which a carrier gas (e.g., argon) is used to eject ions from a target, which then pass through a mixture of the carrier gas and a reactive gas (e.g., oxygen), or plasma, before being deposited.

In some embodiments, the effects of the deposition process of the layers deposited on the silver conductive layer on the quality of the silver conductive layer are disclosed. Since the silver conductive layer is desirably thin, for example, less than 20 nm, to provide high visible light transmission, the quality of the silver conductive layer can be affected by the deposition of the subsequently deposited layer, such as the barrier layer or the antireflective layer.

In some embodiments, sputter deposition processes, which can be applied for a barrier layer deposited on a conductive layer are disclosed. For example, the barrier layer can protect the infrared reflective layer from being oxidized. The oxide layer can function as an antireflective layer. The materials of the barrier layer can reduce reaction for the conductive underlayer such as oxidation, preventing resistivity and emissivity degradation.

In some embodiments, deposition processes, and coated articles fabricated from the process, using a layer having an alloy of a high oxygen affinity material and a low oxygen affinity material during the sputter deposition, for example, to achieve higher quality coated layers and coated panels are disclosed.

In some embodiments, the alloy barrier layer can be sputtered from an alloyed target, or co-sputtered from different elemental targets onto the same substrate. The process may be in pure Ar (which will deposit a pure metallic barrier layer), or may include oxygen to make the film slightly oxidized.

Figure 2A:
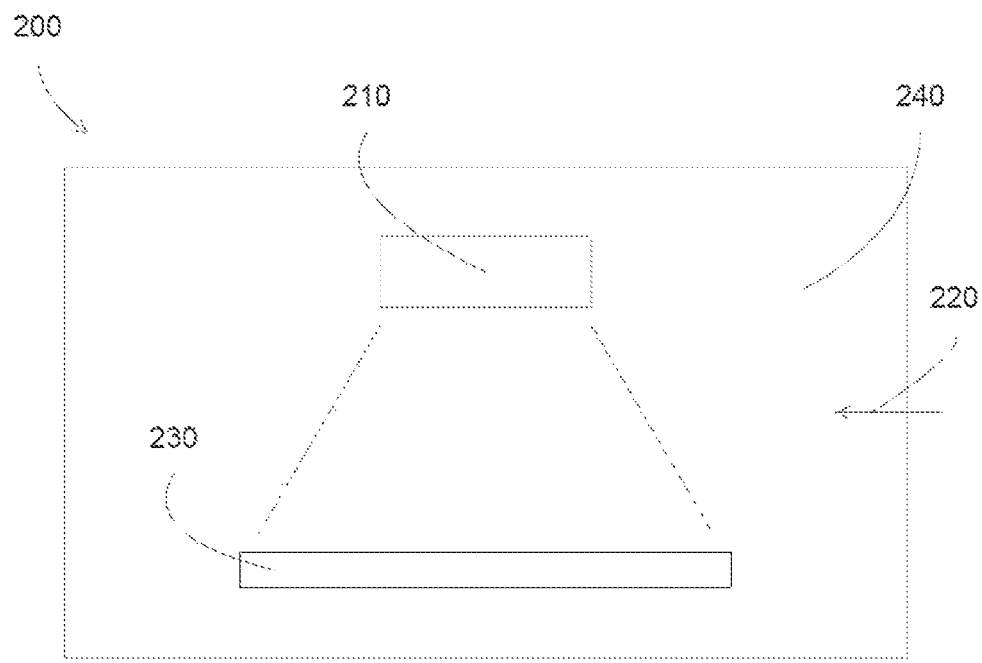
FIGS. 2A-2B illustrate physical vapor deposition (PVD) systems according to some embodiments.
Figure 2B:
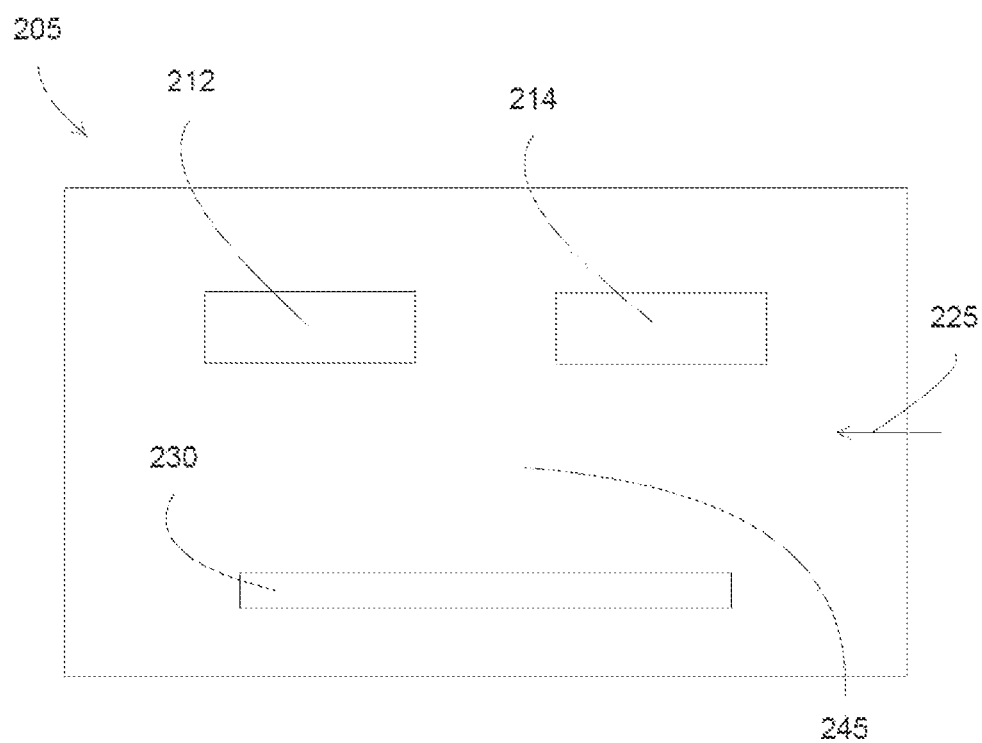

FIGS. 2A-2B illustrate physical vapor deposition (PVD) systems according to some embodiments. In FIG. 2A, a PVD system, also commonly called sputter system or sputter deposition system, 200 includes a housing that defines, or encloses, a processing chamber 240, a substrate 230, a target assembly 210, and reactive species delivered from an outside source 220. During deposition, the target is bombarded with argon ions, which releases sputtered particles toward the substrate 230. The sputter system 200 can perform blanket deposition on the substrate 230, forming a deposited layer that cover the whole substrate, e.g., the area of the substrate that can be reached by the sputtered particles generated from the target assembly 210.

The materials used in the target 210 may, for example, include tin, zinc, magnesium, aluminum, lanthanum, yttrium, titanium, antimony, strontium, bismuth, niobium, silicon, silver, nickel, chromium, copper, gold, or any combination thereof (i.e., a single target may be made of an alloy of several metals). Additionally, the materials used in the targets may include oxygen, nitrogen, or a combination of oxygen and nitrogen in order to form the oxides, nitrides, and oxynitrides of the metals described above. Additionally, although only one target assembly 210 is shown, additional target assemblies may be used. As such, different combinations of targets may be used to form, for example, the dielectric layers described above. For example, in some embodiments in which the barrier material is titanium-nickel-niobium, the titanium, the nickel, and the niobium may be provided by separate titanium, nickel, and niobium targets, or they may be provided by a single titanium-nickel-niobium alloy target. For example, the target assembly 210 can comprise a silver target, and together with argon ions to sputter deposit a layer on substrate 230. The target assembly 210 can include a metal or metal alloy target, such as tin, zinc, or tin-zinc alloy, and together with reactive species of oxygen to sputter deposit a metal or metal alloy oxide layer.

The sputter deposition system 200 can include other components, such as a substrate support for supporting the substrate. The substrate support can include a vacuum chuck, electrostatic chuck, or other known mechanisms. The substrate support can be capable of rotating around an axis thereof that is perpendicular to the surface of the substrate. In addition, the substrate support may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

In some embodiments, the substrate support includes an electrode which is connected to a power supply, for example, to provide a RF or DC bias to the substrate, or to provide a plasma environment in the process housing 240. The target assembly 210 can include an electrode which is connected to a power supply to generate a plasma in the process housing. The target assembly 210 is preferably oriented towards the substrate 230.

The sputter deposition system 200 can also include a power supply coupled to the target electrode. The power supply provides power to the electrodes, causing material to be, at least in some embodiments, sputtered from the target. During sputtering, inert gases, such as argon or krypton, may be introduced into the processing chamber 240 through the gas inlet 220. In embodiments in which reactive sputtering is used, reactive gases may also be introduced, such as oxygen and/or nitrogen, which interact with particles ejected from the targets to form oxides, nitrides, and/or oxynitrides on the substrate.

The sputter deposition system 200 can also include a control system (not shown) having, for example, a processor and a memory, which is in operable communication with the other components and configured to control the operation thereof in order to perform the methods described herein.

In some embodiments, methods and apparatuses for making layers above the thin low resistive silver layer, including controlling the ion energy on the substrate, so that the deposition is performed at a low ion energy, which can reduce damage to the silver underlayer are disclosed.

FIG. 2B shows a sputter system having co-sputtering targets according to some embodiments. A sputter deposition chamber 205 can include two targets 212 and 214 disposed in a plasma environment 245, containing reactive species delivered from an outside source 225. The targets 212 and 214 can include a first element of the alloy barrier, e.g., Ta, Nb, Zr, Hf, Mn, Y, Si, and Ti and a second element of the alloy barrier, e.g., Pd, Ru, Ni, Co, Mo, and W, together with optional reactive species of oxygen to deposit an alloy of barrier layer on substrate 230. This configuration serves as an example, and other sputter system configurations can be used, such as a single target having an alloy material.

In some embodiments, methods and apparatuses for making low emissivity panels, including forming an infrared reflective layer formed under or over a barrier structure that includes a ternary alloy of titanium, nickel and niobium are disclosed. The panels can exhibit optimal infrared reflectance, thermal stability and durability, for example, due to the barrier layer protecting the infrared reflective layer while not degrading the low emissivity coating characteristics.

In some embodiments, methods for making low emissivity panels in large area coaters are disclosed. A transport mechanism can be provided to move a substrate under one or more sputter targets, to deposit a conductive layer underlayer before depositing a barrier layer, an antireflective layer, together with other layers such as a surface protection layer.

In some embodiments, in-line deposition systems, including a transport mechanism for moving substrates between deposition stations are disclosed.

FIG. 3 illustrates an exemplary in-line deposition system according to some embodiments. A transport mechanism 370, such as a conveyor belt or a plurality of rollers, can transfer substrate 330 between different sputter deposition stations. For example, the substrate can be positioned at station #1, having a target assembly 310A, then transferred to station #2, having target assembly 310B, and then transferred to station #3, having target assembly 310C. The station #1 having target 310A can be a silver deposition station, sputtering an infrared reflective layer having silver. The station #2 having target 310B can be a barrier deposition station, sputtering a metallic alloy having titanium, nickel and niobium materials. As shown, the station #2 includes a single target 310B. However, other configurations can be used, such as co-sputtering system utilizing two different targets. The station #3 having target 310C can be used to deposit other layers, such as an antireflective layer or a protection layer.

In some embodiments, specific composition percentages of titanium, nickel and niobium are provided to achieve excellent performance in all properties, including optical and mechanical properties. High percentage of niobium can be used to improve the mechanical properties, including adhesion, thermal stability, and panel durability. For example, higher than 40 wt % of niobium can be used to obtain a desired mechanical durability, e.g., comparable with NiCr alloy barriers and much better than titanium barriers. Lower than 60 wt % of niobium can be used to not degrading the optical performance, e.g., maintaining similar or better visible light transmission with low reflection or absorption. A low percentage of titanium can be used, e.g., to provide oxygen diffusion barrier properties. For example, higher than 5 wt % of titanium can be used to provide good oxygen barrier. Lower than 15 wt % of titanium can be used and can still provide excellent barrier protection. A medium percentage of nickel, e.g., lower than that of niobium and higher than that of titanium, can be used to further improve the mechanical properties and maintaining the oxygen barrier properties. For example, between 30 and 50 wt % of nickel can enhance properties of both titanium and niobium without any degradation. In some embodiments, the barrier thickness can be between 0.3 and 8 nm, such as between 0.5 and 5 nm.

In some embodiments, specific composition percentages of nickel, titanium, and niobium are provided to achieve excellent performance, at least with respect to, absorption, resistance, and emissivity (i.e., relatively low). For example, higher than 40 wt % of niobium can be used to obtain a desired mechanical durability, e.g., comparable with NiCr alloy barriers and much better than titanium barriers. Lower than 60 wt % of niobium can be used to not degrading the optical performance, e.g., maintaining similar or better visible light transmission with low reflection or absorption. A low percentage of nickel (e.g., between 5 wt % and 15 wt %) can be used with a medium percentage of titanium, (e.g., lower than that of niobium and higher than that of nickel, such as between 30 wt % and 50 wt %). In some embodiments, the barrier thickness can be between 0.3 and 8 nm, such as between 0.5 and 5 nm.

Figure 4:
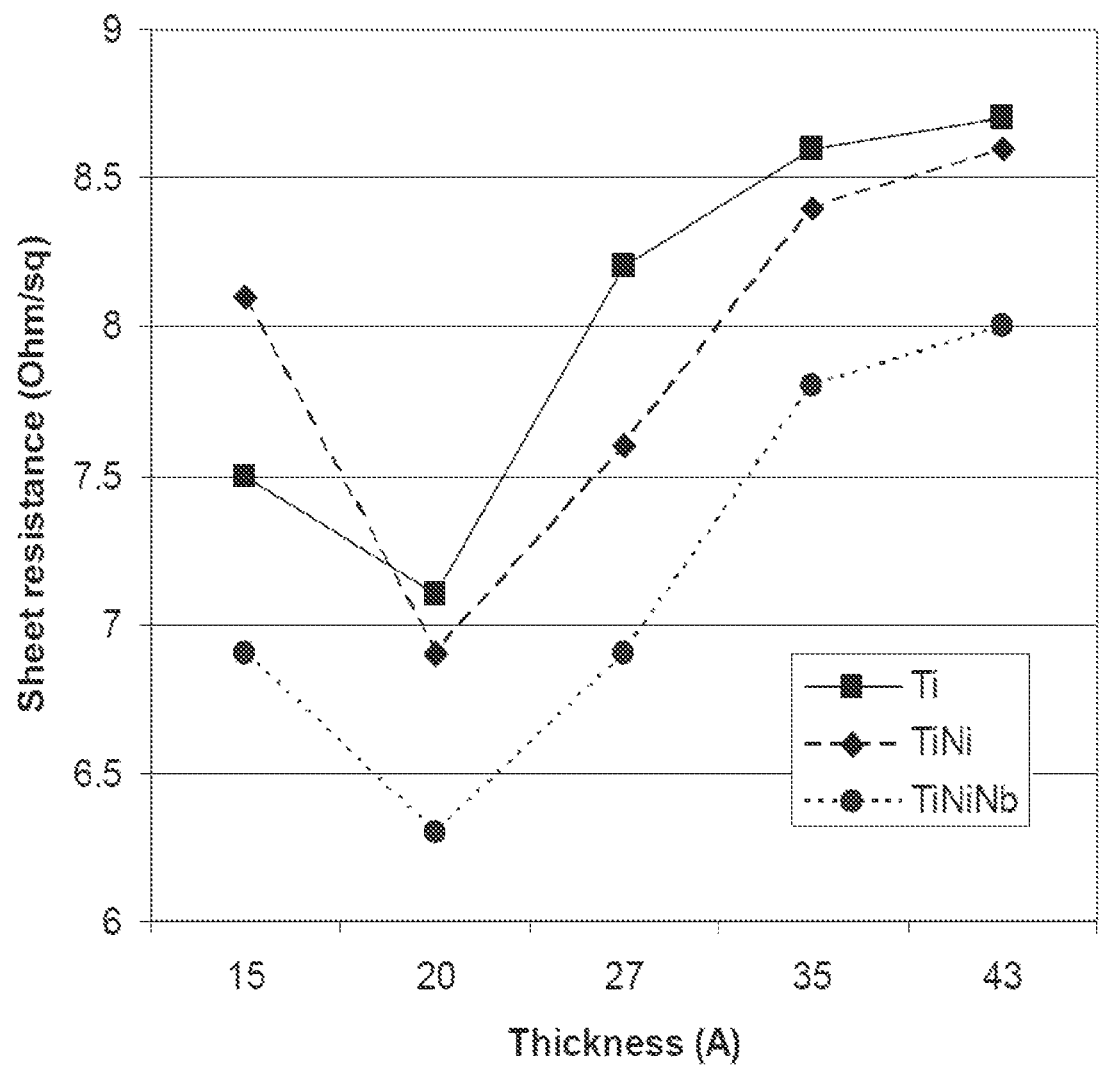
FIG. 4 illustrates a sheet resistance response of a low-e stack having different barrier materials according to some embodiments.

FIG. 4 illustrates a sheet resistance response of a low-e stack having different barrier materials according to some embodiments. The sheet resistance can provide an evaluation of optical properties, with lower sheet resistance values, for a same silver layer thickness, correlated to higher transmission and lower reflection. Low-e stacks used on the sheet resistance measurement include a barrier layer on an 8 nm silver layer on a 10 nm ZnO seed layer. The barrier materials include titanium, titanium nickel alloy having 20 wt % titanium and 80 wt % nickel, and titanium nickel niobium alloy with 10 wt % nickel, 40 wt % titanium and 50 wt % niobium. The thicknesses of the barriers range from 0.3 nm to 7 nm, such as from 1.5 nm to 4.5 nm.

As shown, the ternary alloy of titanium, nickel, and niobium has lower sheet resistance, e.g., better optical performance, for all thicknesses, as compared to titanium and titanium nickel binary alloy. In this particular example, optimum barrier performance can be at around 2 nm, e.g., between 1.5 and 2.7 nm.

Figure 5:
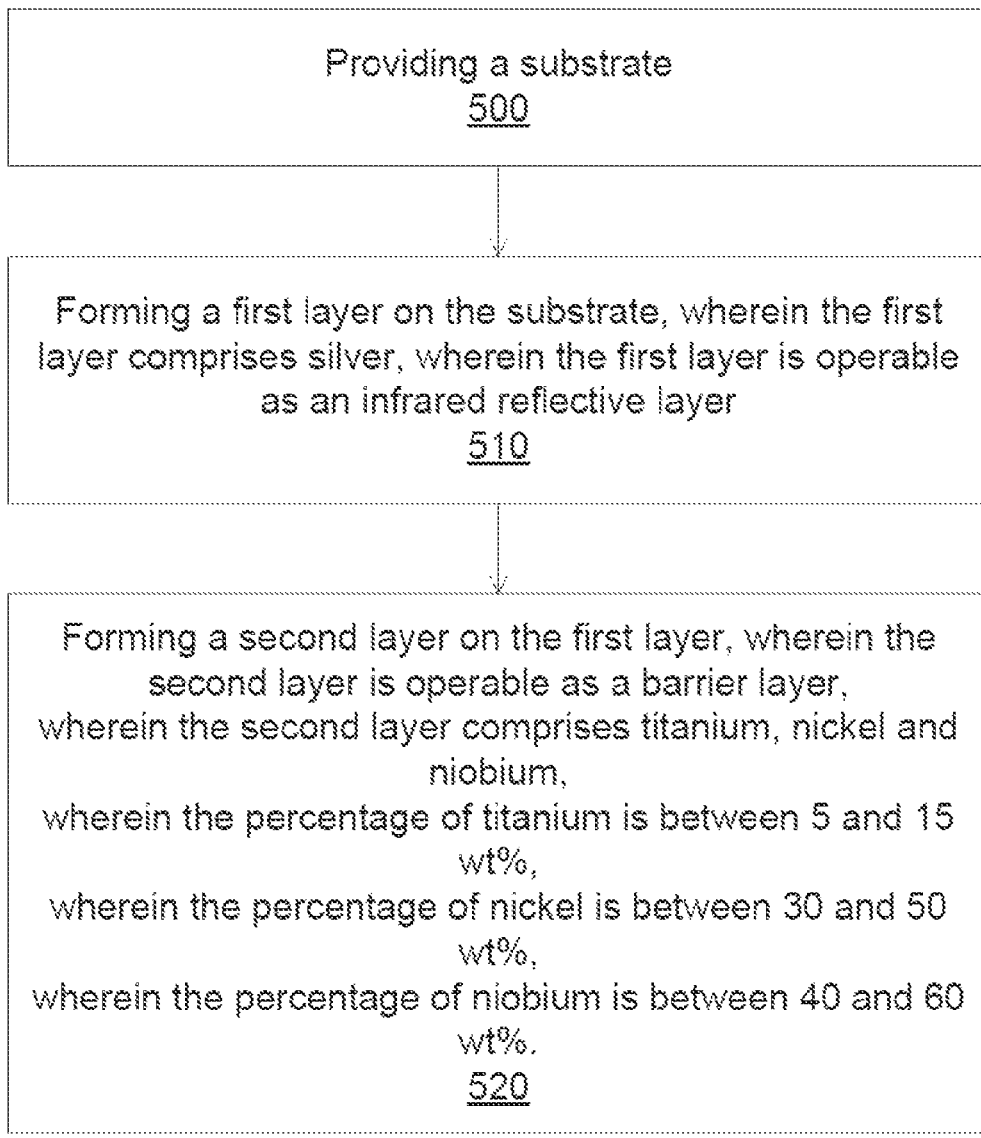
FIG. 5 illustrates a flow chart for sputtering coated layers according to some embodiments.

FIG. 5 illustrates a flow chart for sputtering coated layers according to some embodiments. After forming a conductive layer on a substrate, such as a silver layer, a barrier layer can be sputtered deposited on the conductive layer. The barrier layer can include a ternary alloy of titanium, nickel and niobium, including ternary metal alloys, e.g., consisting of the metal components of titanium, nickel, and niobium, and ternary oxide alloys, e.g., comprising titanium, nickel, niobium, and oxygen.

In operation 500, a substrate is provided. The substrate can be a transparent substrate, such as a glass substrate or a polymer substrate. Other substrates can also be used. In operation 510, a first layer is formed on the substrate. The first layer can be operable as an infrared reflective layer. The first layer can include a conductive material or a metallic material such as silver. The thickness of the first layer can be less than or equal to about 20 nm, or can be less than or equal to about 10 nm.

In operation 520, a second layer is sputter deposited on the first layer. The second layer can be operable as a barrier layer. The second layer can include an alloy of titanium, nickel and niobium. The percentage of titanium can be between 5 and 15 wt %, the percentage of nickel can be between 30 and 50 wt % (or between 35 and 45 wt %), and the percentage of niobium can be between 40 and 60 wt % (or between 45 and 45 wt %).

In some embodiments, the second layer can include an alloy of nickel, titanium, and niobium. The percentage of nickel can be between 5 and 15 wt %, the percentage of titanium can be between 30 and 50 wt % (or between 35 and 45 wt %), and the percentage of niobium can be between 40 and 60 wt % (or between 45 and 45 wt %).

In some embodiments, the second layer can also include oxygen to form an oxide alloy. The second layer can be deposited as a ternary metal alloy or a ternary oxide alloy. The ternary metal alloy can be oxidized, for example, by a subsequent layer deposition, to become a ternary oxide layer. The ternary oxide alloy can also be further oxidized. After a full stack deposition and/or heat treatment, the second layer can remain a ternary metal alloy, or can become a ternary oxide or a ternary sub-oxide for better emissivity performance.

In some embodiments, an underlayer can be formed under the first layer, such as a seed layer of ZnO for the silver layer. The seed layer can enhance the crystal orientation of silver, leading to better conductivity. In some embodiments, other layers can be formed on the second layer.

Figure 6:
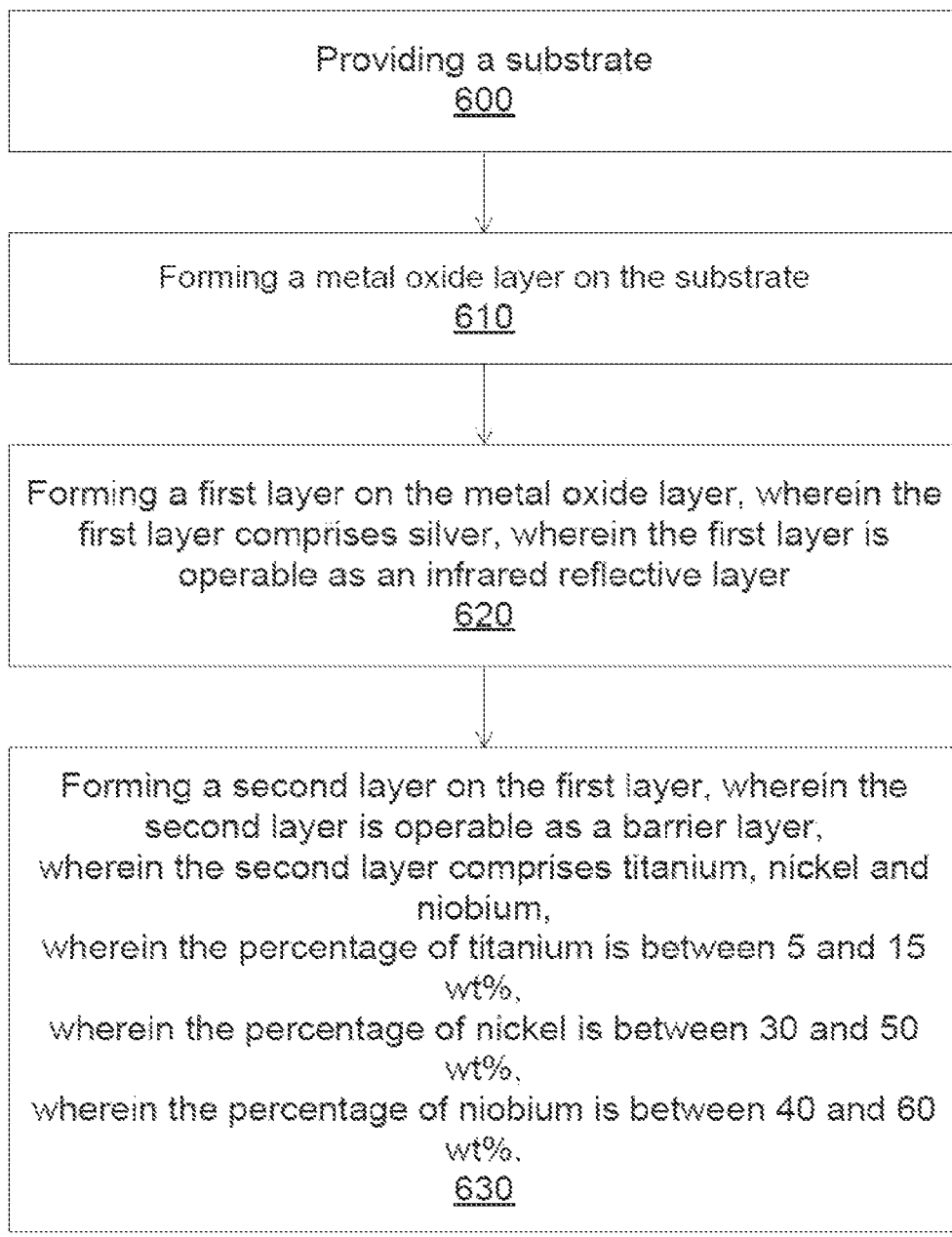
FIG. 6 illustrates a flow chart for sputtering coated layers according to some embodiments.

FIG. 6 illustrates a flow chart for sputtering coated layers according to some embodiments. After forming a conductive layer on a substrate, such as a silver layer, a barrier layer can be sputtered deposited on the conductive layer. The barrier layer can include a ternary alloy of titanium, nickel and niobium.

In operation 600, a substrate is provided. The substrate can be a transparent substrate, such as a glass substrate or a polymer substrate. Other substrates can also be used. In operation 610, a metal oxide layer is formed on the substrate. The metal oxide layer can functioned as a seed layer for the subsequent layer. For example, the metal oxide layer can have a crystal orientation that promotes a crystal orientation of the to-be-deposited first layer.

In some embodiments, the metal oxide layer can include a seed layer having a crystal orientation that promotes a (111) crystal orientation of a silver layer. For example, the metal oxide layer can include ZnO having (002) crystal orientation, which can served as a template for growing (111) silver layer. The thickness of the metal oxide layer can be less than or equal to about 20 nm, or can be less than or equal to about 10 nm.

In operation 620, a first layer is formed on the metal oxide layer. The first layer can be operable as an infrared reflective layer. The first layer can include a conductive material or a metallic material such as silver. The thickness of the first layer can be less than or equal to about 20 nm, or can be less than or equal to about 10 nm.

In operation 630, a second layer is sputter deposited on the first layer. The second layer can be operable as a barrier layer. The second layer can include an alloy of titanium, nickel and niobium. The percentage of titanium can be between 5 and 15 wt %, the percentage of nickel can be between 30 and 50 wt % (or between 35 and 45 wt %), and the percentage of niobium can be between 40 and 60 wt % (or between 45 and 45 wt %).

In some embodiments, the second layer can include an alloy of nickel, titanium, and niobium. The percentage of nickel can be between 5 and 15 wt %, the percentage of titanium can be between 30 and 50 wt % (or between 35 and 45 wt %), and the percentage of niobium can be between 40 and 60 wt % (or between 45 and 45 wt %).

In some embodiments, the second layer can also include oxygen to form an oxide alloy. The second layer can be deposited as a ternary metal alloy or a ternary oxide alloy. The ternary metal alloy can be oxidized, for example, by a subsequent layer deposition, to become a ternary oxide layer. The ternary oxide alloy can also be further oxidized. After a full stack deposition and/or heat treatment, the second layer can remain a ternary metal alloy, or can become a ternary oxide or a ternary sub-oxide for better emissivity performance. In some embodiments, other layers can be included.

In some embodiments, the barrier layer (e.g., barrier layer 115 in FIG. 1A and/or barrier layer 156 in FIG. 1B) includes (e.g., consists of) a ternary alloy that includes less nickel than titanium and niobium (e.g., between 5 and 15 wt % nickel, between 30 and 50 wt % titanium, and between 40 and 60 wt %). The performance of the resulting barrier layer may vary based (at least in part) on, for example, the amount of niobium compared to nickel and/or titanium.

FIG. 7 illustrates a data related to the performance of various materials for use in barrier layers. The materials represented include nickel chromium alloy (i.e., 80 wt % nickel and 20 wt % chromium), nickel titanium, and various nickel titanium niobium alloys (i.e., 15:60:25, 10:40:50, and 5:20:75). Of particular interest in FIG. 7 is the performance of the 10:40:50 nickel titanium niobium compared to the other materials, particularly the other nickel titanium niobium materials.

For example, when a relatively low amount of niobium is used (e.g., 15 wt % nickel, 60 wt % titanium, and 25 wt % niobium), the layer may exhibit relatively poor absorption (i.e., Avis, Abs % at 400 nm, 550 nm, and 1000 nm), but desirable resistance (i.e., Rs) and emissivity (i.e., ε), at least compared to nickel chromium and nickel titanium. On the other hand, when a relatively high amount of niobium is used (e.g., 5 wt % nickel, 20 wt % titanium, and 75 wt % niobium), the absorption is desirable, but the resistance and emissivity are relatively poor. As is shown, performance is optimized (at least relatively) by using 50 wt % niobium (e.g., 10 wt % nickel, 40 wt % titanium, and 50 wt % niobium), as absorption, resistance, and emissivity are all desirable (i.e., relatively low).

Figure 8:
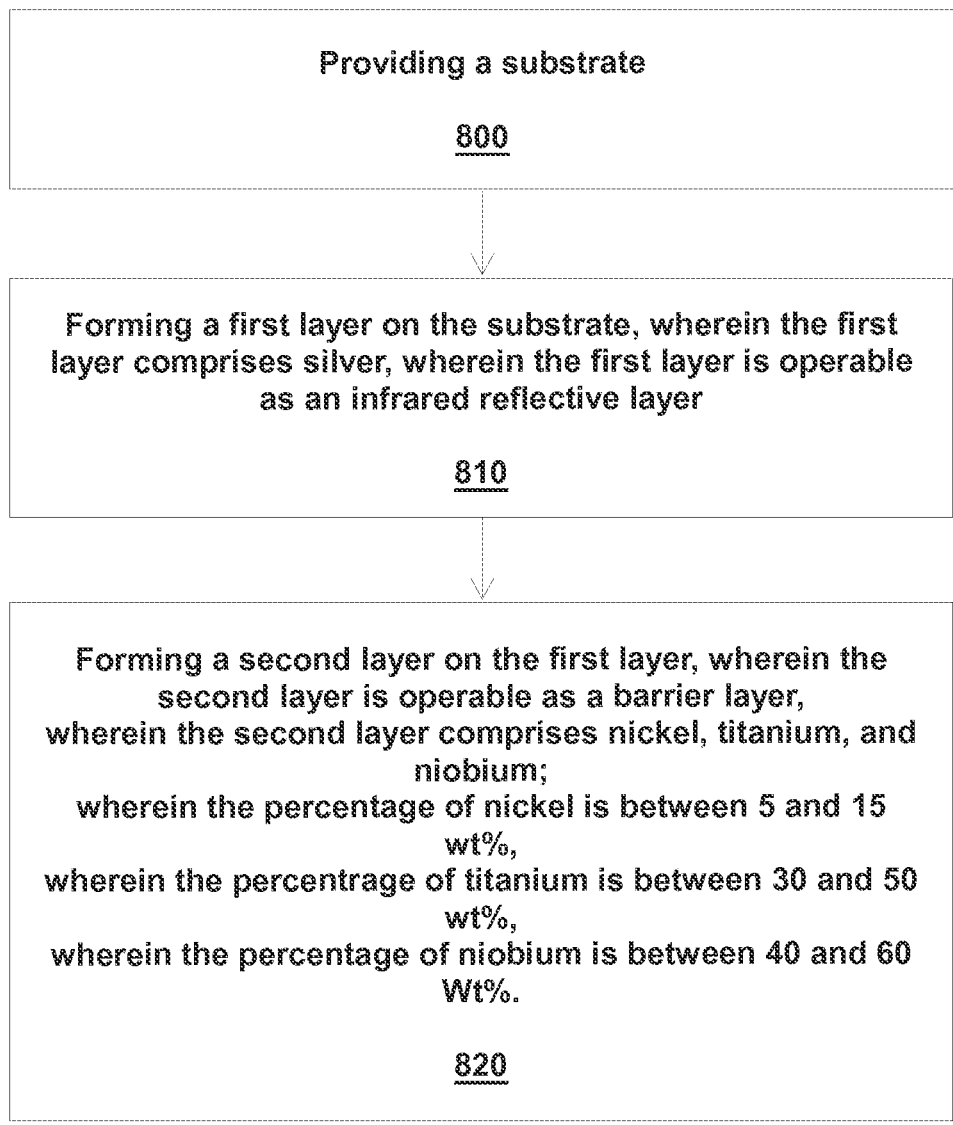
FIG. 8 illustrates a flow chart for sputtering coated layers according to some embodiments.

FIG. 8 illustrates a flow chart for sputtering coated layers according to some embodiments. After forming a conductive layer on a substrate, such as a silver layer, a barrier layer can be sputtered deposited on the conductive layer. The barrier layer can include a ternary alloy of nickel, titanium, and niobium, including ternary metal alloys, e.g., consisting of the metal components of nickel, titanium, and niobium, and ternary oxide alloys, e.g., comprising nickel, titanium, niobium, and oxygen.

In operation 800, a substrate is provided. The substrate can be a transparent substrate, such as a glass substrate or a polymer substrate. Other substrates can also be used. In operation 810, a first layer is formed on the substrate. The first layer can be operable as an infrared reflective layer. The first layer can include a conductive material or a metallic material such as silver. The thickness of the first layer can be less than or equal to about 20 nm, or can be less than or equal to about 10 nm.

In operation 820, a second layer is sputter deposited on the first layer. The second layer can be operable as a barrier layer. The second layer can include an alloy of nickel, titanium, and niobium. The percentage of nickel can be between 5 and 15 wt % (e.g., 10 wt %, or about 10 wt %), the percentage of titanium can be between 30 and 50 wt % (e.g., 40 wt %, or about 40 wt %), and the percentage of niobium can be between 40 and 60 wt % (e.g., 50 wt %, or about 50 wt %).

In some embodiments, the second layer can also include oxygen to form an oxide alloy. The second layer can be deposited as a ternary metal alloy or a ternary oxide alloy. The ternary metal alloy can be oxidized, for example, by a subsequent layer deposition, to become a ternary oxide layer. The ternary oxide alloy can also be further oxidized. After a full stack deposition and/or heat treatment, the second layer can remain a ternary metal alloy, or can become a ternary oxide or a ternary sub-oxide for better emissivity performance.

In some embodiments, at least some of the other layers shown, and described above with reference to, FIG. 1B may also be formed over the substrate to form a low emissivity transparent panel. For example, in some embodiments, an underlayer can be formed under the first layer, such as a seed layer of ZnO for the silver layer. The seed layer can enhance the crystal orientation of silver, leading to better conductivity. In some embodiments, other layers can be formed on the second layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of forming a low emissivity panel, the method comprising:
    providing a glass substrate;
    forming a layer comprising Si and Zr directly on and contacting the glass substrate;
    forming a layer comprising zinc oxide on the glass substrate over at least the layer comprising Si and Zr;
    forming a first (IR) reflective layer comprising silver on the glass substrate, the first IR reflective layer comprising silver being formed directly on and contacting the layer comprising zinc oxide;
    forming a layer comprising an alloy comprising nickel, titanium, and niobium on the glass substrate over and directly contacting the first IR reflective layer comprising silver, wherein Nb has the largest metal content of any metal in said alloy;
    wherein the percentage of nickel in the alloy is about 10 wt %, the percentage of titanium in the alloy is about 40 wt %, and the percentage of niobium in the alloy is about 50 wt %; and
    forming a layer comprising tin oxide on the glass substrate over at least the layer comprising the alloy of nickel, titanium, and niobium.

2. The method of claim 1, wherein a thickness of the layer comprising the alloy comprising nickel, titanium, and niobium is between 0.3 nm and 7 nm.

3. The method of claim 1, wherein the layer comprising the alloy of nickel, titanium, and niobium further comprises oxygen.

4. The method of claim 1, wherein the thickness of the IR reflective layer is less than 15 nm.

5. A method of forming a low emissivity panel, the method comprising:
    providing a transparent glass substrate;
    forming a layer comprising Si and Zr directly on and contacting the glass substrate;
    forming a layer comprising zinc oxide over at least the layer comprising Si and Zr;
    forming an IR reflective layer comprising silver above the transparent substrate, wherein the IR reflective layer comprising silver is located over and directly contacting said layer comprising zinc oxide;
    forming a layer comprising an alloy comprising nickel, titanium, and niobium above and directly contacting the IR reflective layer comprising silver, wherein niobium has the largest metal content of any metal in said alloy;
    wherein the percentage of nickel in the alloy is from 5-15 wt %, the percentage of titanium in the alloy is from 30-50 wt %, and the percentage of niobium in the alloy is from 40-60 wt %; and
    forming a layer comprising tin oxide on the glass substrate over at least the layer comprising the alloy of nickel, titanium, and niobium.

6. The method of claim 5, wherein a thickness of the layer comprising the alloy comprising nickel, titanium, and niobium is between 0.3 nm and 7 nm.

7. The method of claim 5, wherein the layer comprising the alloy comprising nickel, titanium, and niobium is oxided.

8. The method of claim 1, wherein the alloy consists essentially of Nb, Ti and Ni.

* * * * *